United States Patent [19]

Gillard

[11] Patent Number: 5,221,363
[45] Date of Patent: Jun. 22, 1993

[54] SOLAR CELL WINDOW FITTING

[75] Inventor: Calvin W. Gillard, Palo Alto, Calif.

[73] Assignee: Lockheed Missiles & Space Company, Inc., Sunnyvale, Calif.

[21] Appl. No.: 933,919

[22] Filed: Aug. 27, 1992

Related U.S. Application Data

[63] Continuation of Ser. No. 661,980, Feb. 28, 1991, abandoned.

[51] Int. Cl.⁵ .................................... H01L 25/00
[52] U.S. Cl. .................................... 136/248; 136/291;
  52/173.3; 52/473; 52/788
[58] Field of Search ............... 52/173, 213, 788, 790,
  52/473; 136/246, 291, 247, 248

[56] References Cited

U.S. PATENT DOCUMENTS

| | | | |
|---|---|---|---|
| 3,903,665 | 9/1975 | Harrison | 52/173 X |
| 3,925,945 | 12/1975 | White | 52/788 X |
| 4,137,098 | 1/1979 | Field | 136/248 |
| 4,281,488 | 8/1981 | Resibois | 52/173 |
| 4,373,308 | 2/1983 | Whittaker | 52/173 |
| 4,481,265 | 11/1984 | Ezawa et al. | 136/291 X |
| 5,009,044 | 4/1991 | Baughman et al. | 52/173 X |
| 5,040,585 | 8/1991 | Hiraki | 52/788 |

OTHER PUBLICATIONS

Bruce Anderson, "Solar Energy: Fundamentals in Building Design", McGraw-Hill Book Co., (1977), chapter 111-A, pp. 91-97.

*Primary Examiner*—Carl D. Friedman
*Assistant Examiner*—Kien Nguyen
*Attorney, Agent, or Firm*—John J. Morrissey

[57] ABSTRACT

An array of solar cells for supplying electrical energy to a building (e.g., for operating air-conditioning equipment) is mounted in a window fitting, which comprises a pair of transparent glass panes between which a window blind (e.g., of the venetian blind type) is mounted. Solar cells are secured to slats of the window blind so as to be exposed to sunlight incident thereon.

8 Claims, 2 Drawing Sheets

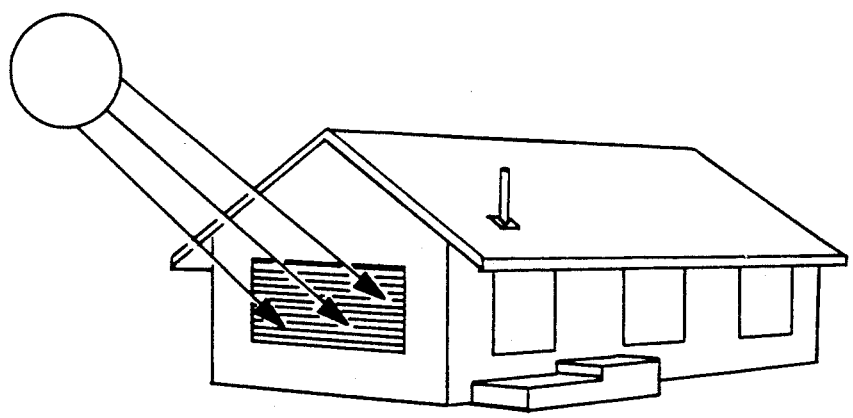
FIG_1
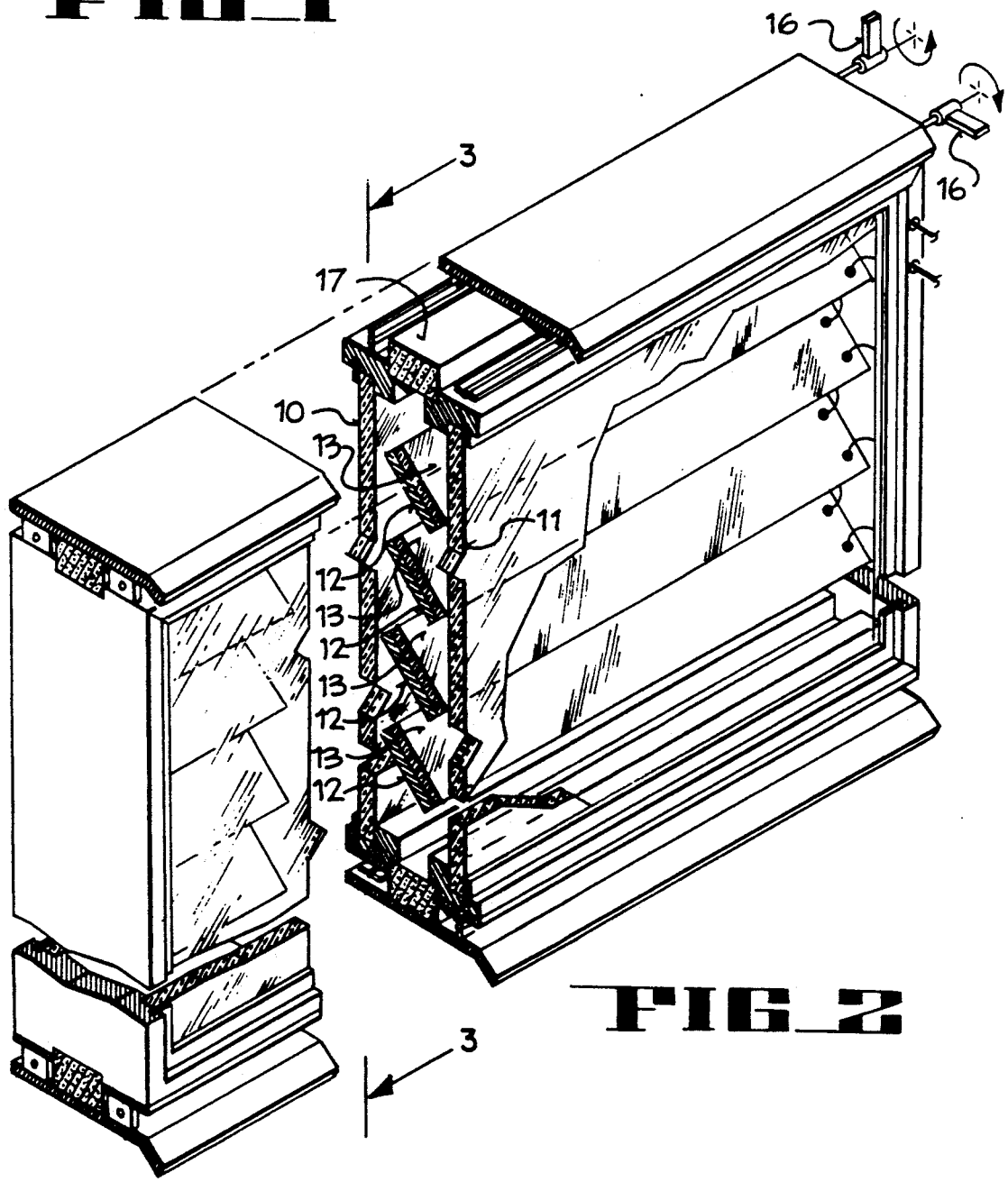
FIG_2

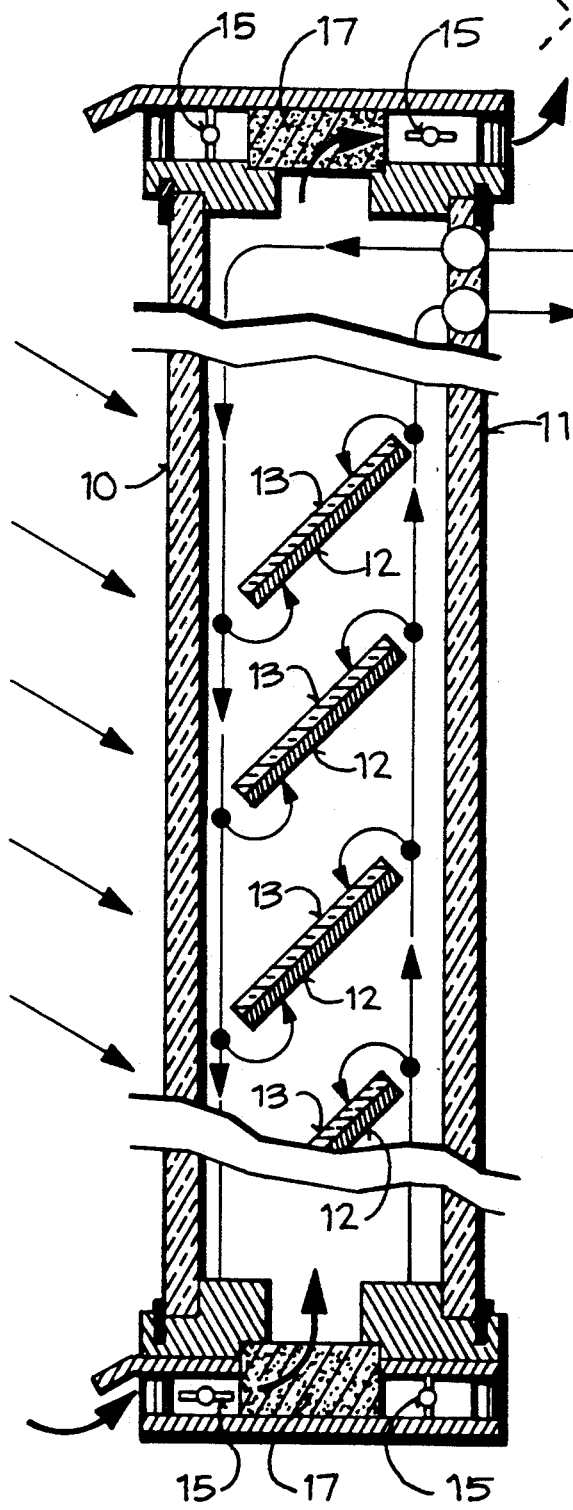
FIG_3
FIG_4
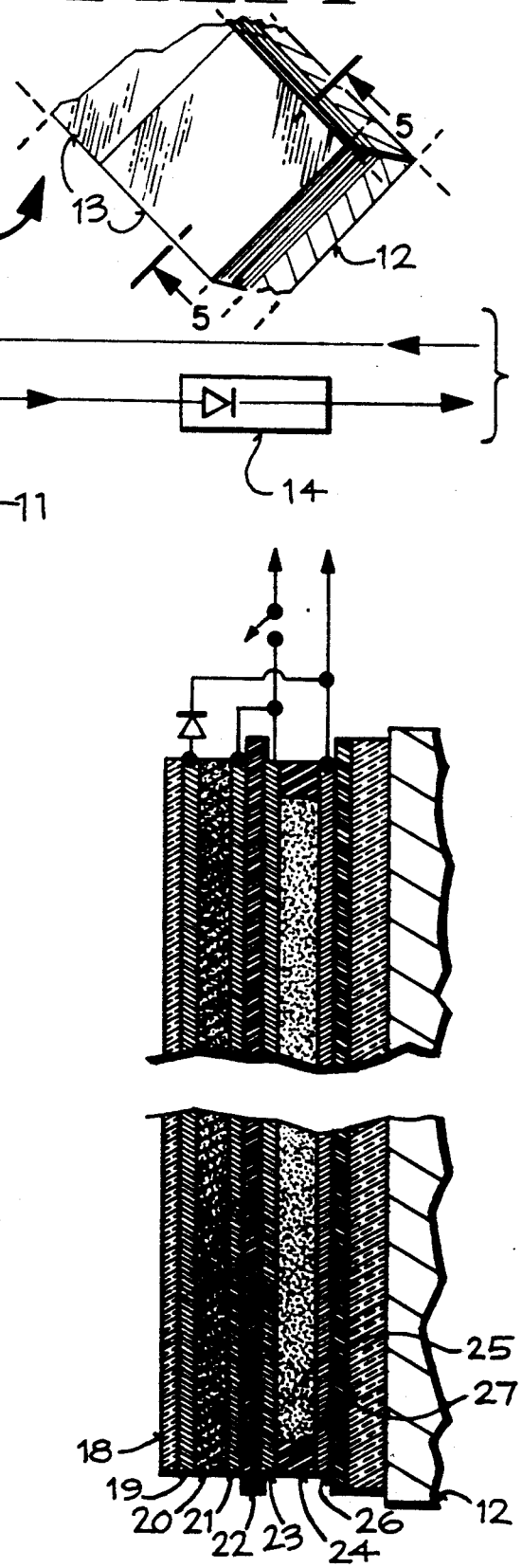
FIG_5

SOLAR CELL WINDOW FITTING

This application is a continuation of Ser. No. 07/661,980 filed on Feb. 28, 1991 now abandoned.

TECHNICAL FIELD

This invention relates generally to solar cell technology, and more particularly to an application of solar cell technology for heating and air-conditioning of buildings.

BACKGROUND OF THE INVENTION

Solar cells for direct conversion of incident sunlight into electrical energy are commercially produced at the present time by a number of companies including General Electric Co., Laser Diode Inc., and Spectrolab Division of Hughes Aircraft Co.

Until recently, utilization of solar cells to provide electrical energy for local consumption (e.g., for supplementing the supply of electrical energy to a building) has generally occurred only on an experimental or demonstration basis. However, significant improvements are continually being made in the efficiency and also in the cost of manufacturing solar cells. Recent studies indicate that in the present state of technology the economic value of electrical energy that can be supplied to a building by an array of solar cells of the photovoltaic type over a specified time period now exceeds the "recovery cost" over that time period allocable to the manufacture of such solar cells. Nevertheless, before widespread adoption of solar cell technology in building construction and renovation can become economically feasible, it will be necessary to develop standardized techniques for integrating networked arrays of solar cells into the designs of new buildings to be constructed, and for retrofitting arrays of solar cells into existing buildings.

SUMMARY OF THE INVENTION

It is an object of the present invention to provide a technique for installing arrays of solar cells in newly constructed buildings, and for retrofitting existing buildings with arrays of solar cells.

It is also an object of the present invention to provide a technique for converting a significant portion of the solar energy incident upon the windows of a building into electrical energy.

In accordance with the present invention, an array of electrically connected solar cells is mounted on individual slat members of a window blind (e.g., a venetian blind) that is dimensioned to fit into a window opening of a building.

More particularly, in accordance with the present invention, a window fitting is provided, which comprises a mounting in which a pair of transparent panes (typically made of glass) is secured so that the panes are in generally parallel disposition with respect to each other; and in which numerous slats are supported in a space between the transparent panes for generally simultaneous and uniform movement through an angular range between an OPEN configuration and a CLOSED configuration (in the manner of, e.g., a venetian blind), so that by adjusting the angular orientation of the slats the passage of sunlight through the window can be blocked or a selectable amount of sunlight can be admitted through the window. It is a feature of the present invention that an array of electrically connected solar cells is mounted on the slats to intercept sunlight incident thereon.

In a particular application of the present invention, electrical energy generated by solar cells mounted on the slats of a window blind that is fitted into a window opening of a building can be supplied to an electrical distribution system for local consumption within the building (e.g., for operating air-conditioning apparatus).

DESCRIPTION OF THE DRAWING

FIG. 1 is an illustration in perspective view of sunlight incident upon a solar cell window fitting according to the present invention, which is installed in a window opening of a building.

FIG. 2 is a perspective view (partly broken away) of a solar cell window fitting according to the present invention.

FIG. 3 is a cross-sectional view along line 3—3 of FIG. 2 of a solar cell window fitting according to the present invention.

FIG. 4 is a perspective view of an end portion of a window-blind slat for use in an alternative embodiment of a window fitting according to the present invention in which solar cells are bonded to corresponding solar-chargeable batteries mounted on the slat.

FIG. 5 is an expanded cross-sectional view along line 5—5 of FIG. 4.

BEST MODE OF CARRYING OUT THE INVENTION

To accommodate integration of networked arrays of solar cells into the designs of new buildings to be constructed, and to facilitate installation of arrays of solar cells in buildings already in existence, an array of solar cells is mounted on an adjustable window blind (e.g., a venetian blind) of a conventional type, which is secured in a window fitting that is dimensioned to fit in a conventional manner into a window opening of a building, as illustrated in FIG. 1.

As shown in perspective view of FIG. 2, a window fitting according to the present invention comprises a conventional double-pane window frame (e.g., of the Thermo-pane type), which supports a pair of transparent glass panes 10 and 11 in parallel disposition with respect to each other. A window blind (illustrated in the drawing as of the venetian blind type) is supported by the window fitting in a space between the glass panes 10 and 11. The window blind comprises numerous slats 12, which are mounted in a conventional manner in generally parallel disposition with respect to each other so as to be simultaneously and uniformly rotatable through an angular range from a CLOSED configuration in which the slats 12 overlap each other so as to block the passage of sunlight into the window opening, through successive intermediate angles at which the slats 12 remain generally parallel to each other, to a fully OPEN configuration in which the slats 12 are positioned so as to permit a maximum amount of incident sunlight to pass through the window opening into the interior of the building.

Within the scope of conventional technology, the slats 12 illustrated in FIG. 2 could be rotated mechanically or electrically, and could be rotated either by action of a human operator or automatically at predetermined times and/or under predetermined circumstances based upon factors such as the intensity of the incident sunlight, the temperature inside the building, and/or some other factor making adjustment of the angle of the slats 12 desirable. Furthermore, depending upon design features of the window blind as appropriate for the particular application, the slats 12 could be rotatable either through a continuous range of angles or only through a set of discrete angles between the CLOSED configuration and the fully OPEN configuration. In accordance with the present invention, there is no requirement that the slats 12 extend horizontally as illustrated in FIG. 2. In particular applications, it might be more appropriate for various reasons (which could be based on aesthetic considerations as well as or instead of technological considerations) for the slats 12 to extend in some other manner—e.g., vertically.

As illustrated in the perspective view of FIG. 2 and in cross-sectional view in FIG. 3, a panel 13 of solar cells is mounted on each slat 12 so as to face outward from the building toward the incident sunlight when the slats 12 are in the CLOSED configuration. The solar cells in each panel 13 are electrically connected to each other, and the panels 13 on the various slats 12 are likewise electrically connected to each other. Electrical energy generated by the solar cells from sunlight incident thereon is removed from the panels 13 by conventional electrical circuitry (as schematically illustrated in FIG. 3), which preferably would include an isolator 14, to a main power bus located within the building. In a preferred embodiment, the solar cells are of the photovoltaic type in which sunlight is converted directly into electrical energy. It should be appreciated, however, that in certain applications the solar cells could be sandwiched with an array of solar-chargeable batteries (e.g., of the nickel-cadmium type), which produce and store electrical energy for delivery to the same power bus.

In FIG. 4, an end portion of one of the slats 12 is shown for an application in which the solar cells (which may be conventional) comprising the panel 13 are bonded to corresponding batteries of the nickel-cadmium type, which are mounted on the slat 12 by a conventional mounting technique. As shown in schematic cross-sectional view in FIG. 5 (not to scale), each of the solar cells comprises a protective transparent covering 18 (as of glass), a first electrode 19, a silicon layer 20, a second electrode 21, and an insulating film 22 (as of Kevlar). Each of the batteries comprises a first electrode 23, an electrically insulating seal 24 that confines a liquid electrolyte 25 (e.g., potassium hydroxide) between the first electrode 23 and a second electrode 26, and an insulting film 27 ( as of Kevlar). An adhesive material such as epoxy can be used to bond the insulating film 22 of the solar cell to the electrode 23 of the battery, and to bond the insulating film 27 of the battery to slat 12.

In the embodiment shown in FIGS. 4 and 5, the individual nickel-cadmium batteries mounted on each of the slats 12 are electrically connected to each other, and the batteries on all of the slats 12 are electrically connected in a conventional manner so as to delivery electrical energy to the power bus as required for the particular application.

The glass panes 10 and 11 defining the space in which the window blind is supported serve to protect the panels 13 of solar cells that are mounted on the slats 12 from damage, and from surface contamination that would otherwise reduce efficiency. Since air in the space between the glass panes 10 and 11 becomes heated by absorption of solar energy, a means is provided to remove the heated air either to the exterior of the building (if the building is to be cooled) or into the interior of the building (if the building is to be heated).

A conventional technique for removing the heated air from the space between the glass panes 10 and 11 involves installing flapper valves 15 in air channels at the top and bottom of the window frame. The valves 15 can be selectively opened and closed so as to allow convection currents to flow through the space between the glass panes 10 and 11 to either the exterior or the interior of the building. When the temperature in the space between the glass panes 10 and 11 exceeds ambient air temperature outside the building and cooling of the interior of the building is desired, the heated air between the glass panes 10 and 11 can be removed to the exterior of the building. When the temperature in the space between the glass panes 10 and 11 exceeds ambient air temperature inside the building and heating of the interior of the building is desired, the heated air between the glass panes 10 and 11 can be removed to the interior of the building.

As illustrated in FIG. 2, the flapper valves 15 could be opened and closed manually by means of handles 16 connected thereto. Alternatively, the valves 15 could be controlled automatically by means of bi-metallic switches pre-set to open and close in response to temperature changes. Air filters 17 can be provided at inlet and outlet regions adjacent corresponding valves 15 to remove particulate material from the air entering and leaving the space between the glass panes 10 and 11.

The window frame that supports the glass panes 10 and 11 could be made of an electrically non-conductive, rigid, durable material such as wood, or could comprise metal (e.g., aluminum) members that are electrically isolated from the solar cell panels 13 and from the associated electrical circuitry. Other types of light-weight materials such as fiber glass and certain kinds of plastic materials are also under consideration for use in fabricating the window frame.

The slats 12 must be strong enough to support the solar cell panels 13, and could be made of a light-weight metal such as aluminum. The slats 12, if made of an electrically conductive material, must be electrically isolated from the solar cell panels 13 by an insulating barrier, which could consist of a layer of Mylar plastic bonded to each slat 12. The back surface of each solar cell facing toward the supporting slat 12 can be metallized in a conventional manner for bonding of the solar cell to the insulating barrier layer on the slat 12. Electrical leads extending from the solar cell panels 13 on the various slats 12 are connected to flexible electrical cable leading outside the window fitting to the main power bus. The flexible electrical cable could also serve to support the slats 12.

Electrical energy generated by the solar cell panels 13 mounted on the slats 12 of a window fitting according to the present invention could be used, e.g., to power conventional air-conditioning apparatus for the building, and/or to distribute heat throughout the building. In an immediate application for the present invention, solar cell window fittings as described herein would be fabricated in standard sizes to fit the window openings of prefabricated portions of buildings designed for speedy erection in a harsh desert environment in which air-conditioning is a practical necessity for human occupants.

In the desert environment of the immediately perceived application of the present invention, conventional electrical power sources are likely to be scarce or unavailable. Consequently, the use of arrays of solar cells under such circumstances to provide electrical power for the air-conditioning of prefabricated buildings has already been under active consideration. Solar cell window fittings according to the present invention would function not only as easily installable mountings for arrays of solar cells, but also as window shades that would be required for the buildings in any case.

The present invention has been described above in terms of a particular embodiment, which has been designed in light of a particular application of immediate importance. However, other embodiments and applications would be apparent to workers skilled in the art upon perusal of the foregoing description and the accompanying drawing. Therefore, the foregoing description is to be considered as illustrative of the invention, while the legal definition of the invention is more generally provided by the following claims and their equivalents.

I claim:
1. A window fitting comprising:
   a) a frame structure dimensioned to fit in a window opening of a building;
   b) a pair of transparent panes supported by said frame structure in substantially parallel disposition with respect to each other to define a space therebetween;
   a window blind secured to said frame structure so as to be disposed in said space between said transparent panes, said window blind comprising a plurality of slats mounted in generally parallel disposition with respect to each other for substantially simultaneous rotation of said slats so that each of said slats moves through an angular range from a CLOSED configuration in which said slats overlap each other so as to block passage of sunlight through said window opening to a fully OPEN configuration in which a maximum amount of sunlight can pass through said window opening;
   d) a plurality of solar-chargeable batteries for storing electrical energy, said batteries being mounted on said slats;
   e) a plurality of solar cells mounted on said batteries so as to be exposed to sunlight incident upon said slats, said batteries thereby being sandwiched between said solar cells and said slats, said solar cells being electrically connected to said batteries so that said batteries can be electrically charged by said solar cells; and
   f) means for removing from said batteries the stored electrical energy that has been generated by said solar cells.

2. The window fitting of claim 1 wherein said window blind is of the venetian blind type.

3. The window fitting of claim 1 further comprising means for removing heated air from said space between said transparent panes.

4. The window fitting of claim 3 wherein said means for removing heated air from said space between said transparent panes comprises valve means attached to said frame structure for removing said heated air by convection.

5. The window fitting of claim 3 wherein said means for removing heated air from said space between said transparent panes comprises means for selectively directing said heated air into or out of said building.

6. The window fitting of claim 1 wherein said slats comprising said window blind are mounted so as to extend generally horizontally within said frame structure when said frame structure is fitted into said window opening.

7. The window fitting of claim 1 wherein said slats comprising said window blind are mounted so as to extend generally vertically within said frame structure when said frame structure is fitted into said window opening.

8. The window fitting of claim 1 wherein said solar-chargeable batteries are of a nickel-cadmium type.

* * * * *